US009509967B2

(12) United States Patent
Samejima et al.

(10) Patent No.: US 9,509,967 B2
(45) Date of Patent: Nov. 29, 2016

(54) LIGHT SOURCE DEVICE AND PROJECTOR

(71) Applicant: USHIO DENKI KABUSHIKI KAISHA, Tokyo (JP)

(72) Inventors: Takanori Samejima, Himeji (JP); Fumihiko Oda, Himeji (JP); Masashi Okamoto, Himeji (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/029,427

(22) PCT Filed: Sep. 19, 2014

(86) PCT No.: PCT/JP2014/074786
§ 371 (c)(1),
(2) Date: Apr. 14, 2016

(87) PCT Pub. No.: WO2015/056522
PCT Pub. Date: Apr. 23, 2015

(65) Prior Publication Data
US 2016/0255313 A1    Sep. 1, 2016

(30) Foreign Application Priority Data

Oct. 15, 2013 (JP) .................................. 2013-214541
Aug. 8, 2014 (JP) .................................. 2014-162038

(51) Int. Cl.
*G03B 21/20* (2006.01)
*H04N 9/31* (2006.01)
(Continued)

(52) U.S. Cl.
CPC .......... *H04N 9/3158* (2013.01); *G03B 21/204* (2013.01); *G03B 21/2013* (2013.01);
(Continued)

(58) Field of Classification Search
CPC .......... G03B 21/2013; G03B 21/2033; G03B 21/2053; G03B 21/204; H04N 9/3129; H04N 9/3132; H04N 9/3135; H04N 9/3138; H04N 9/315; H04N 9/3155; H04N 9/3158; H04N 9/3161; H04N 9/3164
See application file for complete search history.

(56) References Cited

U.S. PATENT DOCUMENTS

RE37,524 E  *  1/2002  Taguchi .............. H01S 5/06832
                                            372/29.011
6,345,062 B1 *  2/2002  Taguchi ............... G11B 7/1263
                                            372/38.01
(Continued)

FOREIGN PATENT DOCUMENTS

JP       H10-133303 A      5/1998
JP       2000-294871 A    10/2000
(Continued)

OTHER PUBLICATIONS

International Search Report of PCT/JP2014/074786, mailed Nov. 18, 2014.
(Continued)

*Primary Examiner* — Bao-Luan Le
(74) *Attorney, Agent, or Firm* — Studebaker & Brackett PC

(57) ABSTRACT

To avoid accelerated progression of deterioration of a semiconductor laser, an LED, and the like to extend their lives while adjusting a balance of a plurality of colors, such as R, G, and B, by feedback control, a deterioration controllable monochromatic light source module is configured to: calculate a substantial upper limit Iu, determine an operation coefficient hx based on a deterioration coefficient dx, perform feedback control of the output current Ix of each drive circuit, and output a light intensity detection signal to the outside. An integrating control circuit calculates a monochromatic light intensity sum σ by a sum of light intensity detection signals from the monochromatic light source modules belonging to the same wavelength band and determines a light intensity target signal so that a ratio of the monochromatic light intensity sum σ to the monochromatic light source modules in different wavelength bands is a predetermined ratio.

8 Claims, 7 Drawing Sheets

(51) Int. Cl.
*H01S 5/042* (2006.01)
*H01S 5/0687* (2006.01)

(52) U.S. Cl.
CPC ....... *G03B21/2033* (2013.01); *G03B 21/2053* (2013.01); *H01S 5/042* (2013.01); *H01S 5/0687* (2013.01); *H04N 9/315* (2013.01); *H04N 9/3155* (2013.01); *H04N 9/3161* (2013.01); *H04N 9/3164* (2013.01)

(56) References Cited

U.S. PATENT DOCUMENTS

| | | | | |
|---|---|---|---|---|
| 6,408,013 | B1* | 6/2002 | Akagi | H01S 5/06808 372/29.021 |
| 8,979,278 | B2* | 3/2015 | Narikawa | G03B 21/204 353/85 |
| 9,046,753 | B2* | 6/2015 | Takamatsu | G03B 21/2033 |
| 9,063,401 | B2* | 6/2015 | Kuriaki | G03B 21/16 |
| 9,155,161 | B2* | 10/2015 | Murai | H04N 9/31 |
| 2005/0162619 | A1* | 7/2005 | Hamaya | H04N 9/3182 353/69 |
| 2006/0170883 | A1* | 8/2006 | Matsui | G09G 3/3413 353/85 |
| 2006/0279710 | A1* | 12/2006 | Tani | H04N 5/7458 353/85 |
| 2011/0043764 | A1* | 2/2011 | Narikawa | G03B 21/204 353/31 |
| 2012/0200800 | A1 | 8/2012 | Kurita | |
| 2013/0271732 | A1* | 10/2013 | Kuriaki | G03B 21/16 353/31 |

FOREIGN PATENT DOCUMENTS

| | | |
|---|---|---|
| JP | 2004-252112 A | 9/2004 |
| JP | 2004-296841 A | 10/2004 |
| JP | 2011-044367 A | 3/2011 |
| JP | 2012-094396 A | 5/2012 |
| JP | 2012-182112 A | 9/2012 |
| JP | 2012-215755 A | 11/2012 |

OTHER PUBLICATIONS

An Office Action, "Decision to Grant a Patent," issued by the Japanese Patent Office on Aug. 18, 2015, which corresponds to Japanese Patent Application No. 2014-162038, with English language translation.
Notification of Transmittal of Translation of the International Preliminary Report on Patentability and Translation of International Preliminary Report of the International Searching Authority; PCT/JP2014/074786 issued on Apr. 28, 2016.

* cited by examiner

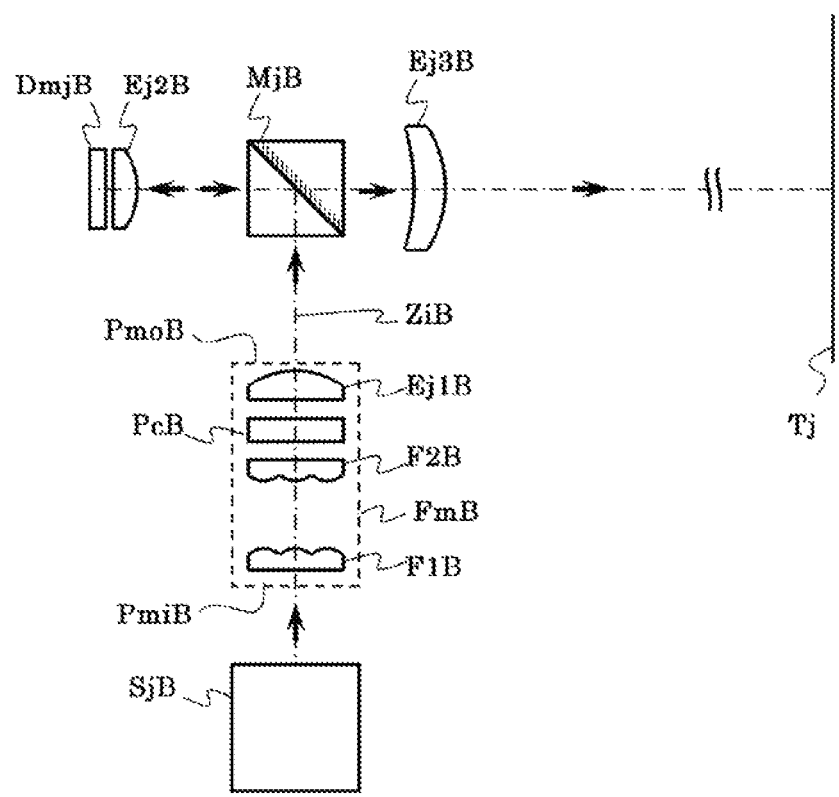

LIGHT SOURCE DEVICE AND PROJECTOR

TECHNICAL FIELD

The present invention relates to a light source device usable in an optical apparatus such as a projector, belonging to a plurality of types of different wavelength bands, and using a light emitting element such as a semiconductor laser.

BACKGROUND ART

For example, in a projector for image display, such as a DLP™ projector and a liquid crystal projector, and a photomask exposure apparatus, a high intensity discharge lamp (an HID lamp) such as a xenon lamp and a super-high pressure mercury lamp has been used. As an example, a principle of a projector is described using FIG. 6 (see JP-A-2004-252112, etc.). FIG. 6 is a view for explaining one embodiment of a portion of one type of conventional projector according to the projector of the present invention.

As described above, light from a light source (SjA) formed of a high intensity discharge lamp or the like enters an incident end (PmiA) of light uniformizing means (FmA) with the help of focusing means (illustration thereof is omitted) formed of a concave reflector, lens, or the like, and the entering light is output from an emission end (PmoA). Here, for example, an optical guide may be used as the light uniformizing means (FmA). The optical guide is also called by a name such as a rod integrator or a light tunnel, and may be constituted of a rectangular cylinder formed of a light transmissive material such as glass or resin. Light input to the incident end (PmiA) propagates inside the light uniformizing means (FmA) while repeatedly being totally reflected by side faces of the light uniformizing means (FmA) in accordance with a principle the same as that of an optical fiber. This achieves a function of sufficiently uniformizing illuminance on the emission end (PmoA) even when distribution of the light input to the incident end (PmiA) is non-uniform.

Incidentally, regarding the optical guide described above, in addition to the above-described optical guide constituted of a rectangular cylinder formed of a light transmissive material such as glass or resin, there is an optical guide which is constituted of a hollow rectangular cylinder having inner faces being reflectors, causes light to propagate therein while, similarly, repeatedly reflecting the light with the inner faces, and thereby achieves a similar function.

An illumination lens (Ej1A) is disposed so that a square image of the emission end (PmoA) is formed on a two-dimensional light amplitude modulation element (DmjA), whereby the two-dimensional light amplitude modulation element (DmjA) is illuminated with the light output from the emission end (PmoA). However, in FIG. 6, a mirror (MjA) is disposed between the illumination lens (Ej1A) and the two-dimensional light amplitude modulation element (DmjA). Then, the two-dimensional light amplitude modulation element (DmjA) directs the light to a direction entering an image projection lens (Ej2A) for each pixel, according to a video signal, or the two-dimensional light amplitude modulation element (DmjA) modulates the light to direct the light to a direction not entering the image projection lens (Ej2A) for each pixel, and, thus, to display an image on a screen (Tj).

Note that the two-dimensional light amplitude modulation element as described above is also called light bulb, and in the case of the optical system of FIG. 6, DMD™ (Digital micro-mirror device) is generally often used as the two-dimensional light amplitude modulation element (DmjA).

Regarding the light uniformizing means, in addition to the above-described optical guide, there is light uniformizing means called a fly eye integrator. As an example, a principle of a projector using this light uniformizing means is described using FIG. 7 (see JP-A-2004-142141, etc.). FIG. 7 is a view for explaining one embodiment of a portion of one type of conventional projector according to the projector of the present invention.

Light from a light source (SjB) constituted of a high intensity discharge lamp or the like enters, as substantially parallel luminous flux, an incident end (PmiB) of the light uniformizing means (FmB) formed of a fly eye integrator with the help of collimator means (illustration thereof is omitted) formed of a concave reflector, lens, or the like, and the entering light is output from an emission end (PmoB). Here, the light uniformizing means (FmB) is configured by combination of a front fly eye lens (F1B) on incident side, a rear fly eye lens (F2B) on exit side, and an illumination lens (Ej1B). Each of the front fly eye lens (F1B) and the rear fly eye lens (F2B) is formed by vertically and horizontally arranging many square lenses having the same focal length and the same shape.

Each of the front fly eye lenses (F1B) and the corresponding lens of the rear fly eye lens (F2B) on the rear stages of the corresponding front fly eye lenses constitute an optical system called a Kohler illumination optical system, and thus, many Kohler illumination optical systems are arranged vertically and horizontally. Typically, Kohler illumination optical system is constituted of two lenses. When this optical system collects light with a front lens to illuminate a target surface, the two lenses are disposed so that the front lens forms a light source image not on the target surface but on a surface of a center of a rear lens, and the rear lens forms an image of a square of an outer shape of the front lens on the target surface (a surface desired to be illuminated), whereby the target surface is uniformly illuminated. The action of the rear lens is to prevent phenomenon occurred in a case where the rear lens is not provided, when the light source is not a complete point light source and has a finite size, illuminance in the periphery of the square on the target surface is dropped depending on the size. The rear lens allows uniform illuminance over to the periphery of the square on the target surface without depending on the size of the light source.

Here, in the case of the optical system in FIG. 7, since substantially parallel luminous flux basically enters the light uniformizing means (FmB), the front fly eye lens (F1B) and the rear fly eye lens (F2B) are disposed so that a distance therebetween becomes equal to the focal length thereof, and thus, an image on the target surface of uniform illumination as Kohler illumination optical system is generated to the infinity. Incidentally, since the illumination lens (Ej1B) is disposed on a rear stage of the rear fly eye lens (F2B), the target surface is drawn on a focal plane of the illumination lens (Ej1B) from the infinity. Each of the many Kohler illumination optical systems arranged vertically and horizontally is parallel to an incident optical axis (ZiB), and luminous flux enters each of the Kohler illumination optical systems substantially axisymmetrically to the center axis thereof. Therefore, output luminous flux is also axisymmetrical. Accordingly, images of the outputs of all of the Kohler illumination optical systems are formed on the same target surface on the focal plane of the illumination lens (Ej1B) by property of the lens in which light beams entering a lens surface at the same angle are refracted to travel toward the same point on the focal plane irrespective of incident positions of the respective light beams on the lens surface, namely, Fourier transform function of the lens.

As a result, illumination distributions on the respective lens surfaces of the front fly eye lenses (F1B) are all overlapped, and thus a synthesized square image whose illuminance distribution is more uniform than that in the case of one Kohler illumination optical system, is formed on the incident optical axis (ZiB). When the two-dimensional light amplitude modulation element (DmjB) is disposed on the position of the synthesized square image, the two-dimensional light amplitude modulation element (DmjB) serving as an illumination target is illuminated with light output from the emission end (PmoB). Incidentally, in the illumination, a polarization beam splitter (MjB) is disposed between the illumination lens (Ej1B) and the two-dimensional light amplitude modulation element (DmjB) to reflect the light toward the two-dimensional light amplitude modulation element (DmjB). Then, the two-dimensional light amplitude modulation element (DmjB) modulates the light and reflects the modulated light such that the polarization direction of light for each pixel is rotated by 90 degrees or is not rotated, according to a video signal, whereby only the rotated light passes through the polarization beam splitter (MjB) and enters an image projection lens (Ej3B), thereby displaying an image on the screen (Tj).

In the optical system in FIG. 7, LCOS™ (silicon liquid crystal device) is commonly often used as the two-dimensional light amplitude modulation element (DmjA). In such a liquid crystal device, since only a component of light in a specified polarization direction is effectively modulated, a component of light parallel to the specified polarization direction is normally transmitted without being modulated. However, a polarization aligning function element (PcB) that rotates polarization direction of only a component of light perpendicular to the specified polarization direction by 90 degrees and consequently allows all of light to be effectively used may be interposed, for example, on a rear stage of the rear fly eye lens (F2B). In addition, for example, a field lens (Ej2B) may be interposed immediately before the two-dimensional light amplitude modulation element (DmjB) so that substantially parallel light enters the two-dimensional light amplitude modulation element (DmjB).

Incidentally, regarding a two-dimensional light amplitude modulation element, in addition to the reflective two-dimensional light amplitude modulation element illustrated in FIG. 7, a transmissive liquid crystal device (LCD) is used to have an optical arrangement adopted therein (see JP-A-10-133303, etc.).

Incidentally, in a typical projector, to perform color display of an image, for example, a dynamic color filter such as a color wheel is disposed on the rear stage of the light uniformizing means to illuminate the two-dimensional light amplitude modulation element with color sequential luminous fluxes of R, G, and B (red, green, and blue), and color display is achieved time-divisionally. Alternatively, a dichroic mirror or a dichroic prism is disposed on the rear stage of the light uniformizing means to illuminate the two-dimensional light amplitude modulation element that is provided independently for each color, with light color-separated to three primary colors of R, G, and B, and a dichroic mirror or a dichroic prism is disposed to configure an optical system for performing color synthesis of the modulated luminous fluxes of the three primary colors of R, G, and B. However, to avoid complication, these are omitted in FIGS. 6 and 7.

However, the above-described high intensity discharge lamp has disadvantages such as low conversion efficiency from supplied power to optical power, that is, large heating loss, short life, or the like. As an alternate light source overcoming these disadvantages, a solid light source such as an LED and a semiconductor laser has attracted attention in recent years. Among them, in the LED, as compared with the discharge lamp, the heating loss is small, and the life is long. However, since light emitted from the LED does not have directivity similarly to the discharge lamp, there is a problem that usage efficiency of light is low in an application capable of using only light in a certain direction, such as the above-described projector and an exposure apparatus.

On the other hand, the semiconductor laser has a disadvantage that speckle occurs due to high coherency, but the disadvantage is overcome by various technical improvement such as usage of a diffuser plate. In the semiconductor laser, similarly to LED, the heating loss is small, the life is long, and in addition, the directivity is high. Therefore, the semiconductor laser has an advantage that usage efficiency of light is high in the application capable of using only light in a certain direction, such as the above-described projector and an exposure apparatus. Moreover, in the semiconductor laser, optical transmission can be performed with high efficiency through an optical fiber while utilizing the high directivity, and therefore, the installation position of the semiconductor laser can be separated from the position of a projector or the like using the light, so that flexibility of device designing can be enhanced.

PRIOR ART DOCUMENTS

Patent Documents

Patent Document 1: JP-A-2000-294871

SUMMARY OF THE INVENTION

Problems to be Solved by the Invention

Incidentally, in a semiconductor laser or the like, even in the case where the same current flows, light emission wavelength and light emission intensity vary due to environment temperature variation or temperature increase by self heating, and further due to deterioration accompanying an increase of accumulated energization time. When semiconductor lasers as light sources of a projector are used in some or all of three primary colors of R, G, and B, such changes change color and brightness of the entire image. Accordingly, when the semiconductor laser is applied to a highly faithful projector, stabilization of each of three primary colors and the color combination ratio, that is, stabilization of white balance are required.

Even if an amount of light from a semiconductor laser changes accompanying the above-described temperature change and deterioration, the light intensity can be corrected by feedback control so that the light intensity for each color or the light intensity of each semiconductor laser matches a target value. However, in the case of a projector, although accuracy of the above-described white balance is important, absolute accuracy of brightness is not so important. Despite of this, if the feedback control method is simply used so that brightness matches a target value of a prescribed brightness, when light emission efficiency is reduced by deterioration of a semiconductor laser, an electric current increases to compensate for the reduced light emission efficiency. Therefore, there is a problem that deterioration progresses at an accelerated rate, and this causes a rapid end of the life.

In order to prevent this, it is considered that the target value in the feedback control may be changed according to the condition of the semiconductor laser. For example, JP-A-2000-294871 (Patent Document 1) proposes a technique in which in an application of recording/reproducing information to an optical information storage medium, output of emission power of a semiconductor laser is stabilized, and when the emission power of the semiconductor power is controlled to desired power by comparing an output value of power detection means and a target value, the target value is corrected. As target value correction means, Patent Document 1 describes means that corrects the target value based on a threshold current and differential quantum efficiency of the semiconductor laser, means that corrects the target value by detecting the temperature of the semiconductor laser, and means that corrects the target value by measuring the operating time of the semiconductor laser.

However, the effect is to achieve the emission power of the semiconductor laser with high accuracy even if the threshold current and the differential quantum efficiency of the semiconductor laser change, and this effect is not effective for the above-described problem that deterioration of the semiconductor laser progresses at an accelerated rate.

A problem to be solved by the present invention is to provide a light source device and a projector which avoid an accelerated progression of deterioration of a semiconductor laser, an LED, and the like to extend their lives while adjusting a balance of a plurality of colors, such as R, G, and B, by feedback control.

Means for Solving the Problems

In a light source device of the first invention according to the present invention, which emits radiation luminous fluxes (F, F', F", . . . ) in a plurality of wavelength bands to the outside, a deterioration controllable monochromatic light source module (Up), which has light emitting elements (Y1, Y2, . . . ) each emitting light in a specific wavelength band and emits radiation luminous fluxes (F) from the light emitting elements to the outside, further has drive circuits (P1, P2, . . . ) driving the light emitting elements (Y1, Y2, . . . ), a light emission control circuit (Mp) controlling the drive circuits (P1, P2, . . . ), and light intensity detection means (A) detecting a light intensity of the radiation luminous flux (F) to generate a light intensity detection signal (Se) and transmitting the light intensity detection signal (Se) to the light emission control circuit (Mp), and the light emission control circuit (Mp) is configured to, in order to calculate, with respect to an absolute upper limit Im specified by an output current Ix of each of the drive circuits (P1, P2, . . . ), an substantial upper limit Iu, that is a limit value that can be output at that time point, with respect to each of the drive circuits (P1, P2, . . . ), determine an operation coefficient hx of each of the drive circuits (P1, P2, . . . ) to be multiplied with the absolute upper limit Im, based on a deterioration coefficient dx representing a degree of deterioration of each of the light emitting elements (Y1, Y2, . . . ) at that time point, perform feedback control of the output current Ix of each of the drive circuits (P1, P2, . . . ) in a range where the output current Ix does not exceed the substantial upper limit Iu so that the light intensity detection signal (Se) matches a light intensity target signal (Sp) which is a target value thereof and is input from the outside, and output the light intensity detection signal (Se) to the outside.

The light source device includes the deterioration controllable monochromatic light source module (Up), one or more monochromatic light source modules (Up', Up", . . . ), which have a light emitting element to emit the radiation luminous fluxes (F, F', F", . . . ) to the outside, output light intensity detection signals (Se', Se", . . . ), generated by detecting the light intensities of the radiation luminous fluxes (F, F', F", . . . ), to the outside, performs feedback control of a light emitting element drive circuit so that the light intensity detection signal (Se', Se", . . . ) matches a light intensity target signals (Sp', Sp", . . . ) which is a target value thereof and is input from the outside, and is different from the deterioration controllable monochromatic light source module (Up), and an integrating control circuit (Mu) which inputs the light intensity detection signals (Se, Se', Se", . . . ) and, at the same time, generates the light intensity target signals (Sp, Sp', Sp", . . . ) to output the light intensity target signals (Sp, Sp', Sp", . . . ). In this light source device, the integrating control circuit (Mu) calculates a monochromatic light intensity sum σ by a sum of the light intensity detection signals from the monochromatic light source modules belonging to the same wavelength band, among the light intensity detection signals (Se, Se', Se", . . . ) and determines the light intensity target signals (Sp, Sp', Sp", . . . ) so that a ratio of the monochromatic light intensity sum σ to the monochromatic light source modules in different wavelength bands is a predetermined ratio.

In a light source device of the second invention according to the present invention, the deterioration controllable monochromatic light source module (Up) holds an integrating operation total amount Σ in each of the light emitting elements (Y1, Y2, . . . ), and the deterioration coefficient dx is determined positively correlated with a life span consumption rate α that is a value of a ratio of the integrating operation total amount Σ at the present time to an expected upper limit of integrating operation total amount Σf of each of the light emitting elements (Y1, Y2, . . . ).

In a light source device of the third invention according to the present invention, the deterioration controllable monochromatic light source module (Up) detects a light intensity value ρ of a radiation luminous flux emitted from each of the light emitting elements (Y1, Y2, . . . ), and the deterioration coefficient dx is determined negatively correlated with an efficiency maintenance factor β that is a value of a ratio of a light intensity current ratio η to a standard initial value η0 of the light intensity current ratio η. The light intensity current ratio η is calculated by dividing the light intensity value ρ by the output current Ix of each of the drive circuits (P1, P2, . . . ) that is a value of current flowing to each of the light emitting elements (Y1, Y2, . . . ).

In a light source device of the fourth invention according to the present invention, a value of the operation coefficient hx corresponding to a value of the deterioration coefficient dx corresponding to an initial stage of the life of a light emitting element is a specified value less than 1, and the operation coefficient hx is increased to an increase of the deterioration coefficient dx.

In a light source device of the fifth invention according to the present invention, the operation coefficient hx is decreased to an increase of the deterioration coefficient dx.

In a light source device of the sixth invention according to the present invention, a value of the operation coefficient hx corresponding to a value of the deterioration coefficient dx corresponding to an initial stage of the life of a light emitting element is a specified value less than 1, and the operation coefficient hx is kept constant against an increase of the deterioration coefficient dx.

A projector of the seventh invention according to the present invention projects and displays an image using any one of the light source devices according to the first to sixth inventions.

In a projector of the eighth invention according to the present invention, a value of the operation coefficient hx in the light source device is configured to be capable of being calculated by an operation coefficient planning function φ(dx) that is a function of the deterioration function dx, a plurality of operation coefficient planning functions φ(dx) are held, and one of the plurality of the operation coefficient planning functions φ(dx) is selected to be applicable.

Effect of the Invention

The present invention can provide a light source device and a projector which avoid an accelerated progression of deterioration of a semiconductor laser, an LED, and the like to achieve extension of their lives while adjusting a balance of a plurality of colors, such as R, G, and B, by feedback control.

BRIEF DESCRIPTION OF THE DRAWINGS

FIG. 7 is a view for explaining one mode of a portion of a kind of conventional projector according to the projector of the invention.

MODE FOR CARRYING OUT THE INVENTION

Figure 1:
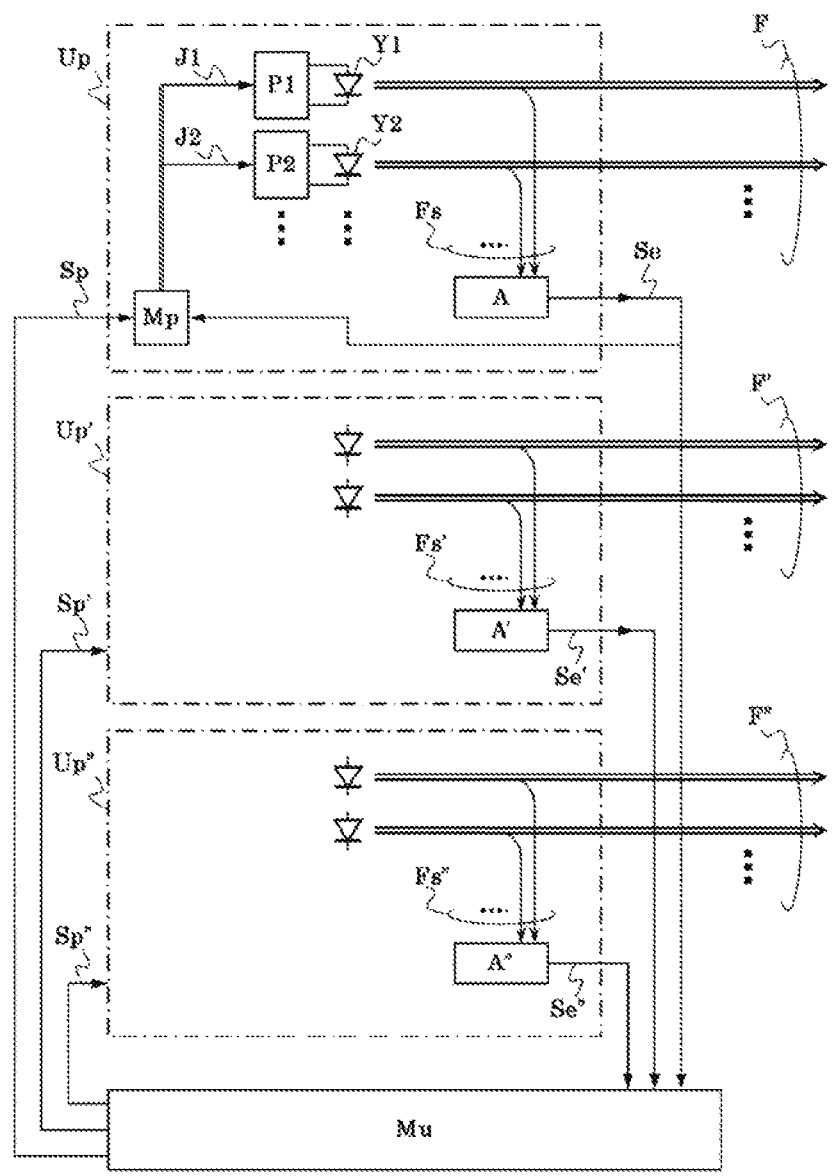
FIG. 1 is a block diagram showing a light source device of the present invention in a simplified manner.

First, an embodiment for practicing the present invention will be described using FIG. 1, which is a block diagram showing a light source device of the invention in a simplified manner. A deterioration controllable monochromatic light source module (Up) has light emitting elements (Y1, Y2, . . . ) each emitting light in a specific wavelength band, such as R, G, or B color, and the light emitting elements emit radiation luminous fluxes (F) to the outside. The light emitting elements (Y1, Y2, . . . ) are driven by drive circuits (P1, P2, . . . ) and the drive circuits (P1, P2, . . . ) are controlled by a light emission control circuit (Mp). Light intensity detection means (A) detects an amount of monitor light (Fs) taken as a portion of the radiation luminous flux (F) by a beam splitter or the like to generate a light intensity detection signal (Se), and, thus, to transmit the signal to the light emission control circuit (Mp).

Regarding the individual light emitting elements (Y1, Y2, . . . ), in this embodiment, the light emitting element is a light source, such as a semiconductor laser or an LED, which converts wavelength of light emitted from a semiconductor laser with the use of non-linear optical phenomenon such as harmonic generation and optical parametric effect. Such a light source may be singly provided, a plurality of the light sources may be connected in series or in parallel, or a plurality of light sources connected in parallel may be connected in series. Such a light source may include an impedance element for current balance. Each light source may be driven by one of the drive circuits (P1, P2, . . . ).

In each of the drive circuits (P1, P2, . . . ), an output current Ix specifies an absolute upper limit Im, and typically, although the absolute upper limit may be specified as an absolute maximum current value that allows outputs of the drive circuits (P1, P2, . . . ), according to conditions of a rated current determined by the manufacturer of the semiconductor laser or the like constituting the light emitting elements (Y1, Y2, . . . ), derating may be performed in consideration of safety so that the absolute upper limit is set to 80% of the absolute maximum current value, for example. In the present invention, aside from this, an substantial upper limit Iu as an operational limit value of current which may actually flow at that time point is determined with respect to each of the drive circuits (P1, P2, . . . ), and as a specific method of determining the substantial upper limit Iu, the substantial upper limit Iu is calculated by multiplying an operation coefficient hx determined with respect to each of the drive circuits (P1, P2, . . . ) by the absolute upper limit Im. Incidentally, the operation coefficient hx is determined based on a deterioration coefficient dx representing a degree of deterioration of each of the light emitting elements (Y1, Y2, . . . ) at that time point.

As described above, in the deterioration controllable monochromatic light source module (Up), since the substantial upper limit Iu of the output current Ix of the drive circuit (P1, P2, . . . ) may be determined according to the degree of deterioration of each of the light emitting elements (Y1, Y2, . . . ), in the light emitting elements (Y1, Y2, . . . ), brightness of emitted light and speed of life consumption having a tradeoff relationship can be controlled intelligently.

On the other hand, a light intensity target signal (Sp) which is a target value to the light intensity detection signal (Se) is generated outside the deterioration controllable monochromatic light source module (Up) and input thereto. In the light emission control circuit (Mp), after the substantial upper limit Iu is calculated for each of the drive circuits (P1, P2, . . . ) as described above, the output current Ix of each of the drive circuits (P1, P2, . . . ) is subjected to feedback control in a range where the output current Ix does not exceed the substantial upper limit Iu so that the light intensity detection signal (Se) matches the light intensity target signal (Sp), and the light intensity detection signal (Se) achieved as a result of the feedback control is output outside.

For example, when the high and low operation coefficients hx for each of the drive circuits (P1, P2, . . . ) are mixed, and even if the output current Ix has reached the substantial upper limit Iu in a certain drive circuit, when there is another drive circuit having a margin in the substantial upper limit Iu, the light emission control circuit (Mp) adjusts allocation of the output current Ix for each of the drive circuits (P1, P2, . . . ) and can perform control so that an excess of the substantial upper limits Iu does not occur in all the drive circuits (P1, P2, . . . ), and, at the same time, a light intensity target based on the light intensity target signal (Sp) is generally achieved. Accordingly, when the output current Ix has reached the substantial upper limit Iu in all the drive circuits (P1, P2, . . . ), the light intensity detection signal (Se) is not achieved with respect to the light intensity target signal (Sp).

Hereinabove, the constitution and operation of the deterioration controllable monochromatic light source module (Up) have been described. Incidentally, the light source device of the present invention has one or more other monochromatic light source modules (Up', Up", . . . ) than the deterioration controllable monochromatic light source module (Up). The monochromatic light source modules (Up', Up", . . . ) have light emitting elements each emitting light in a specific wavelength band, such as R, G, or B color, and the light emitting elements emit radiation luminous fluxes (F', F", . . . ) to the outside. The monochromatic light source modules (Up', Up", . . . ) further each have light intensity detection means (A', A", . . . ), and the light intensity detection means (A', A", . . . ) detects the amount of monitor light (Fs' Fs", . . . ) taken as a portion of the radiation luminous flux (F', F", . . . ) by a beam splitter or the like to generate a light intensity detection signal (Se', Se", . . . ), and, thus, to output the light intensity detection signal (Se', Se", . . . ) to the outside.

Light intensity target signal (Sp', Sp", . . . ) which is a target value to the light intensity detection signal (Se', Se", . . . ) is generated outside the monochromatic light source module (Up', Up", . . . ) and input thereto. Also in the monochromatic light source module (Up', Up", . . . ), a light emitting element drive circuit performs feedback control so that the light intensity detection signal (Se', Se", . . . ) matches the light intensity target signal (Sp', Sp", . . . ), and the light intensity detection signal (Se', Se", . . . ) achieved as a result of the feedback control is output outside. Naturally, when the light intensity target signal (Sp', Sp", . . . ) cannot be achieved, the light intensity detection signal (Se', Se", . . . ) not achieved with respect to this is output.

Incidentally, some or all of the monochromatic light source modules (Up', Up", . . . ) may be the deterioration controllable monochromatic light source module (Up), may have a configuration different from that of the deterioration controllable monochromatic light source module (Up) to perform different operations, or may be combined with each other. However, in at least one of the monochromatic light source modules (Up', Up", . . . ), a light emission wavelength of each light emitting element of the monochromatic light source modules belongs to a wavelength band different from that of each of the light emitting elements (Y1, Y2, . . . ) of the deterioration controllable monochromatic light source module (Up). Accordingly, the light source device of the present invention can emit the radiation luminous fluxes (F, F', F", . . . ) in a plurality of wavelength bands to the outside and typically emits light of three primary colors of R, G, and B.

The light source device of the present invention is further equipped with an integrating control circuit (Mu), and the integrating control circuit (Mu) obtains the light intensity detection signals (Se, Se', Se", . . . ) from the deterioration controllable monochromatic light source module (Up) and the monochromatic light source modules (Up', Up", . . . ) and, at the same time, generates the light intensity target signals (Sp, Sp', Sp", . . . ) to output the signals to the deterioration controllable monochromatic light source module (Up) and the monochromatic light source modules (Up', Up", . . . ). When the light intensity target signals (Sp, Sp', Sp", . . . ) are determined, the integrating control circuit (Mu) calculates, for each of different wavelength bands, a monochromatic light intensity sum σ by a sum of the light intensity detection signals from the monochromatic light source modules belonging to the same wavelength band, among the light intensity detection signals (Se, Se', Se", . . . ). Then, the light intensity target signals (Sp, Sp', Sp", . . . ) are determined so that a ratio of the monochromatic light intensity sum σ to the monochromatic light source modules in different wavelength bands is a predetermined ratio.

The above-described operation for determining the light intensity target signals (Sp, Sp', Sp", . . . ) will be hereinafter described while citing specific examples. For example, there is assumed a case where the light source device has an R color deterioration controllable monochromatic light source module up1 as the deterioration controllable monochromatic light source module (Up), an R color monochromatic light source module up2, G color monochromatic light source modules up3 and up4, and B color monochromatic light source modules up5 and up6 as the monochromatic light source modules (Up', Up", . . . ). In this assumption, the monochromatic light source modules up1, up2, up3, up4, up5, and up6 receive, respectively, light intensity target signal values p1, p2, p3, p4, p5, and p6 as the light intensity target signals (Sp, Sp', Sp", . . . ) from the integrating control circuit (Mu), so that the integrating control circuit (Mu) obtains light intensity detection signal values e1, e2, e3, e4, e5, and e6 as the light intensity detection signals (Se, Se', Se", . . . ).

The integrating control circuit (Mu) calculates a monochromatic light intensity target sum $\phi r$ to R color from p1+p2, calculates a monochromatic light intensity target sum $\phi g$ to G color from p3+p4, and calculates a monochromatic light intensity target sum $\phi b$ to R color from p5+p6 and determines the light intensity target signal values p1, p2, p3, p4, p5, and p6 so that the ratio $\phi r:\phi g:\phi b$ of these monochromatic light intensity target sums is a desired predetermined ratio (for example, 1:1:1). The determined values are given to the monochromatic light source modules up1, up2, up3, up4, up5, and up6. In each monochromatic light source modules, a trial of feedback control is performed, and when the light intensity detection signal values e1, e2, e3, e4, e5, and e6 are obtained by the integrating control circuit (Mu), for example if e1 and e3 are not achieved, the integrating control circuit (Mu) sets the light intensity target signal values p1 and p3 of the light intensity target signal values p1, p2, p3, p4, p5, and p6 to e1 and e3 respectively, recalculates the remaining monochromatic light intensity target sums so that the ratio $\phi r:\phi g:\phi b$ of the monochromatic light intensity target sums obtained by the above-described calculation is a predetermined ratio, and may input the ratio again to the monochromatic light source modules.

By the above operation, or necessary repetition of the above operation until non-achieved light intensity detection signal disappears from the light intensity detection signals e1, e2, e3, e4, e5, and e6, when this has been achieved, if a monochromatic light intensity sum σr to R color is calculated by e1+e2, a monochromatic light intensity sum σg to G color is calculated by e3+e4, and a monochromatic light intensity sum σb to R color is calculated by e5+e6, the ratio of them, that is, a ratio of the monochromatic light intensity sum σr:σg:σb is a desired predetermined ratio (for example, 1:1:1), a desired color balance to a plurality of colors can be achieved.

In this embodiment, for the sake of ease, although it has been described while assuming that scaling between the light intensity detection signal (Se, Se', Se", . . . ) and the light intensity target signal (Sp, Sp', Sp", . . . ) is the same, that is, they can be numerically directly compared/calculated, scaling may be different, and, in this case, they may be compared/calculated after unit conversion. Meanwhile, scaling between the light intensity detection signal (Se, Se', Se", . . . ) in different wavelength bands, that is, of different colors and the light intensity target signal (Sp, Sp', Sp", ... ) may be considered when the ratio σr:σg:σb of the monochromatic light intensity sum and the ratio φr:φg:φb of the monochromatic light intensity target sum are evaluated/determined.

As described above, the light source device of the present invention does not cause electric current up to the rated current to flow in accordance with feedback control so that brightness matches a target value of a prescribed brightness, with indifference to the degree of deterioration of light emitting elements as in the conventional light source device. In the light source device of the invention, the substantial upper limit Iu of electric current to be flowed can be dynamically determined in accordance with the degree of deterioration of the light emitting elements (Y1, Y2, ... ), while adjusting the balance of the plurality of the colors, such as R, G, and B by the feedback control and the life consumption of the light emitting elements (Y1, Y2, ... ) can be progressed as planned, so that the life extension can be achieved. Since the substantial upper limit Iu can be individually set to each of the drive circuits (P1, P2, ... ), that is, each of the light emitting elements (Y1, Y2, ... ), even if the light emitting elements (Y1, Y2, ... ) are entirely in a life consumption state, that is, the deterioration coefficient dx is mixed, the functions of this invention are exercised well.

Here, a supplementary description of the wavelength band of the light emitting element (Y1, Y2, ... ) and a change in the wavelength of a semiconductor laser or the like due to temperature change and so on is given. In the above description, it has been described that the deterioration controllable monochromatic light source module (Up) and the monochromatic light source modules (Up', Up", ... ) have the light emitting elements each emitting light in a specific wavelength band, such as R, G, or B color. This means that integrated light emitted from those monochromatic light source modules functions as light in one wavelength band, but does not necessarily mean that the wavelength is single wavelength or that the bandwidth is narrow. For example, when a certain monochromatic light source module has the light emitting element (Y1, Y2, ... ) emitting light in an R color wavelength band, in addition to the light emitting element emitting light in a narrow R color band as main component light, a light emitting element emitting light in a narrow G color (or B color) band, for example, may be included as additional light.

An advantage obtained from the above configuration will be described. In a light emitting element of a semiconductor laser or the like, the wavelength changes due to temperature change and so on; however, in a change in chromaticity due to this, due to single wavelength, chromaticity coordinates move on a spectrum locus in a chromaticity diagram. Therefore, even if the chromaticity coordinates of main component light of R color move, the chromaticity coordinates can be generally held at a desired position by a suitable increase or decrease in a quantity of additional light of G color (and B color), and namely, a function for performing independent color correction for each color can be achieved. In this case, when the brightness of the main component light is changed, the quantity of additional light is accordingly adjusted, whereby the brightness of R color can be changed without changing the chromaticity. Naturally, the same applies to the case where a monochromatic light source module uses main component light of G or B color. The present invention can be applied to such a light source device having a function for performing independent color correction for each of R, G, or B color.

Meanwhile, in a light source device having no function for performing color correction for each color as described above, a change in an R color wavelength or G and B color wavelengths due to temperature change and so on is detected, and when a ratio of the light intensities of R, G, and B colors for achieving a correct white balance is calculated, this ratio is set to the ratio φr:φg:φb of the monochromatic light intensity target sum, and the above operation may be executed.

Although there are considered various methods of providing the deterioration coefficient dx of each of the light emitting elements (Y1, Y2, ... ) in the deterioration controllable monochromatic light source module (Up), an integrating operation total amount Σ can be adopted as being capable of determining a value without measurement of a special physical quantity other than the output current Ix. For example, focusing on one of the light emitting elements (Y1, Y2, ... ), after the light emitting element was new, a value of time integration of a value of current having been flowed so far, that is, an integrating charge amount Q may be used as the integrating operation total amount Σ. When the integrating charge amount Q, obtained when deterioration of the light emitting elements (Y1, Y2, ... ) progresses due to accumulation of energizing light emission to cause a loss of a practical light emitting performance, that is, an expected upper limit of integrating charge amount Qf is estimated, this is used as an expected upper limit of integrating operation total amount Σf, and a value of a ratio of the integrating operation total amount Σ at the present time to the expected upper limit of integrating operation total amount Σf, that is, a life span consumption rate α calculated by Σ/Σf can be used as the deterioration coefficient dx.

In the calculation of the integrating charge amount Q by the deterioration controllable monochromatic light source module (Up), in a microprocessor constituting the drive circuit (P1, P2, ... ), for example, when programming is performed so that every fixed time, a value at that time point of current flowing to each of the light emitting elements (Y1, Y2, ... ) is added to a variable provided corresponding to each of the light emitting elements (Y1, Y2, ... ) and holding an integrating charge amount, the calculation of the integrating charge amount Q by the deterioration controllable monochromatic light source module (Up) can be easily achieved. Naturally, when any of the light emitting elements (Y1, Y2, ... ) is replaced with a new one, a value of the variable corresponding to the light emitting element and holding the integrating charge amount is initialized to zero.

Although it is considered that the above-described integrating charge amount Q that is time integration of current is reliable as the index of deterioration of a light emitting element, when the deterioration coefficient dx is determined based on the integrating charge amount Q, as described above, the operation coefficient hx is determined as a function using the determined deterioration coefficient dx as a variable, and since the substantial upper limit Iu of current capable of being flowed is determined based on the determined operation coefficient hx, it is found that the degree of deterioration of a light emitting element can be consequently tracked with a certain degree of accuracy only by an energization time. Accordingly, when the above-described programming processing in the microprocessor constituting the drive circuit (P1, P2, ... ) is desired to be simplified, an integrating operation total time τ can be used as the integrating operation total amount Σ. In addition, an expected life time τf till when the practical light emitting performance of the light emitting element (Y1, Y2, ... ) is lost is estimated to be used as the expected upper limit of integrating operation total amount Σf, whereby, as described above, the value of the ratio of the integrating operation total amount Σ, that is, the life span consumption rate α calculated by Σ/Σf can be used as the deterioration coefficient dx.

If the deterioration controllable monochromatic light source module (Up) can detect a light intensity value ρ of the radiation luminous flux emitted from each of the light emitting elements (Y1, Y2, . . . ), a light intensity current ratio η obtained by dividing the light intensity value ρ by the output current Ix of each of the drive circuits (P1, P2, . . . ) can be calculated by the value of current flowing to each of the light emitting elements (Y1, Y2, . . . ), that is, the output current Ix of each of the drive circuits (P1, P2, . . . ), and this is considered to be reliable as an indicator of deterioration of a light emitting element. Because, in a light emitting element of a semiconductor laser or the like, even if the same current flows thereto, the light emission amount is reduced as life consumption progresses. Thus, the deterioration coefficient dx may be determined negatively correlated with a value of a ratio of the light intensity current ratio η to a standard initial value η0, that is, an efficiency maintenance factor β calculated by η/η0, and the deterioration coefficient dx may be determined by 1-β, for example. Here, as the reason why the deterioration coefficient dx is determined negatively correlated manner, for example, although the value of the life span consumption rate α increases as life consumption progresses, the efficiency maintenance factor β described here is reduced as the life consumption progresses.

Incidentally, detection of the light intensity value ρ of each of the light emitting elements (Y1, Y2, . . . ) can be achieved by providing light intensity detection means for each of the light emitting elements (Y1, Y2, . . . ), as the most direct means. However, since a plurality of light intensity detection means of the number corresponding to the number of the light emitting elements (Y1, Y2, . . . ) are required, there is a disadvantage that the cost therefor increases.

However, in the light source device of the present invention, since the deterioration controllable monochromatic light source module (Up) is equipped with the light intensity detection means (A) for the radiation luminous flux (F) formed of the entirety of the light emitting elements (Y1, Y2, . . . ), when operational measures are provided, the light intensity value ρ of each of the light emitting elements (Y1, Y2, . . . ) can be detected without providing the light intensity detection means for each of the light emitting elements (Y1, Y2, . . . ). At the start of operation of the light source device, when the light emission control circuit (Mp) starts energization to the light emitting elements (Y1, Y2, . . . ) of the deterioration controllable monochromatic light source module (Up), the energization of all the light emitting elements is not started, but the drive circuits (P1, P2, . . . ) are sequentially activated one by one while providing a time lag to output the output current Ix suitable for each of them. The light intensity value ρ can be estimated, that is, detected by an increment of a value of the light intensity detection signal (Se) obtained from the light intensity detection means (A) by the light emission control circuit (Mp) at that time.

Incidentally, after one of the drive circuits (P1, P2, . . . ) starts a current output of a given value, in order to stabilize the intensity of light emitted from the corresponding light emitting element, a time corresponding to the magnitude of an emission power of the light emitting element is required. For example, in a light emitting element of an optical power of several ten watts, one minute or more is required to stabilize the emission light intensity. Accordingly, this required time or a time lag exceeding this is provided, and each of the drive circuits (P1, P2, . . . ) may be activated.

However, according to this constitution, depending on the number of the light emitting elements (Y1, Y2, . . . ), there is required an excessive time from activation of an initial one of the drive circuits (P1, P2, . . . ) to acquisition of the value of the light intensity detection signal (Se) to a last one of them, whereby inconvenience may occur. In such a case, after activation of a certain drive circuit and until activation of the next drive circuit, values of the light intensity detection signal (Se) are obtained a plurality of times at a prescribed timing, and the value of the light intensity detection signal (Se) that will be obtained after reaching a steady state is estimated from the condition of the change, whereby the total time required for acquiring this value can be reduced.

In the above description, the method of detecting the light intensity value ρ when the operation of the light source device starts has been described. During the operation of the light source device, if there is a period during which emission light of the light source device is not used, within this period, the drive circuits (P1, P2, . . . ) are sequentially stopped for a short time one by one while providing a time lag. Among the light emitting elements (Y1, Y2, . . . ), in the light emitting element corresponding to the stopped drive circuit, the light intensity value ρ can be detected by variation in the value of the light intensity detection signal (Se) obtained from the light intensity detection means (A) by the light emission control circuit (Mp) at that time.

In the above description, a way of determining the deterioration coefficient dx at that time point regarding each of the drive circuits (P1, P2, . . . ) of the deterioration controllable monochromatic light source module (Up), that is, each of the light emitting elements (Y1, Y2, . . . ) has been described. Hereinafter, a way of determining the operation coefficient hx to the determined deterioration coefficient dx will be described. As described above, since the substantial upper limit Iu as an operational limit value of current which may actually flow at that time point is calculated by multiplying the absolute upper limit Im of the output current Ix of the drive circuit (P1, P2, . . . ) by the operation coefficient hx, the absolute value of the operation coefficient hx is 1.

In the first way of determining the operation coefficient hx to the deterioration coefficient dx, a value of the operation coefficient hx corresponding to a value of the deterioration coefficient dx corresponding to an initial stage of the life of a light emitting element is a specified value less than 1, for example a value selected from a range of 0.4 to 0.8, and the operation coefficient hx is increased to an increase of the deterioration coefficient dx. This can be understood that a plan how the operation coefficient hx is changed to a change of the deterioration coefficient dx is defined in the form of a function and is like an operation coefficient planning function (f1) illustrated in FIG. 2(a), for example. In this drawing, although it is described that the value of the deterioration coefficient dx is mainly in a range of 0 to 1, this depends on how to define the deterioration coefficient dx.

Figure 2A:
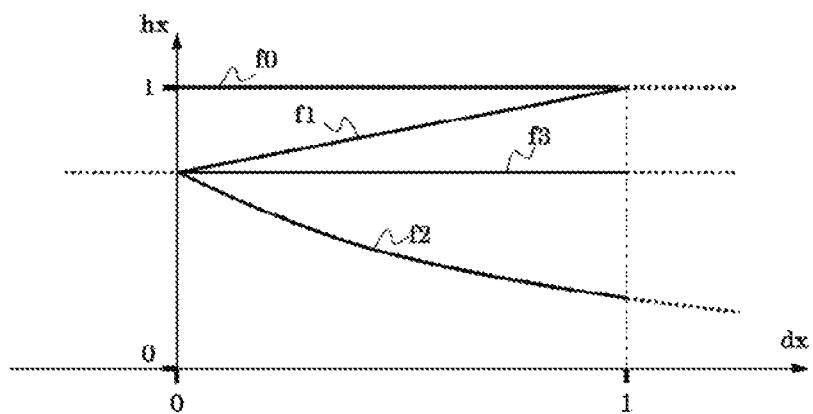
FIGS. 2(a) and 2(b) show functions and curves of the present invention, respectively.
Figure 2B:
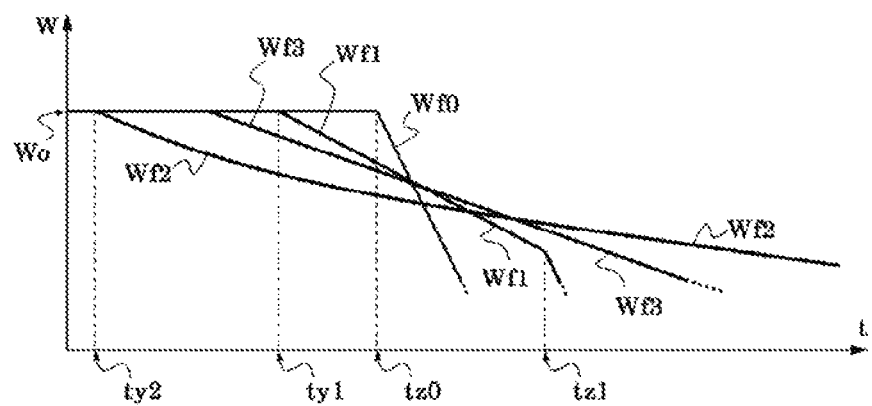

In a case where the light source device is operated while the substantial upper limit Iu of the output current of each of the drive circuits (P1, P2, . . . ) is set based on the operation coefficient planning function, when a time variation of a total light intensity W obtained by gathering all the radiation luminous fluxes (F, F', F", . . . ) is represented, the time variation is like a light intensity maintenance curve (Wf1) illustrated in FIG. 2(b), for example. For comparison, when a time variation of a similar light intensity in a conventional light source device is illustrated, it is like a light intensity maintenance curve (Wf0). Deterioration of a light emitting element progresses, and after a time point (tz0) when it becomes impossible to achieve an initial light intensity target value (Wo), since the output current of the drive circuit continuously flows up to an absolute upper limit, the light intensity is rapidly reduced. Incidentally, in a conventional light source device, since control is performed so that the output current of a drive circuit can flow up to the absolute upper limit with indifference to deterioration of a light emitting element, if a relationship between the deterioration coefficient dx and the operation coefficient hx is represented, the operation coefficient hx is steadily 1 like a relation line (f0) of FIG. 2(a).

In the light intensity maintenance curve (Wf1), while the light emitting element (Y1, Y2, . . . ) is new, the initial light intensity target value (Wo) is maintained similarly to the light intensity maintenance curve (Wf0). However, since the value of the operation coefficient hx is a specified value less than 1, for example 0.7, it becomes impossible to achieve the initial light intensity target value (Wo) at a time point (ty1) earlier than the light intensity maintenance curve (Wf0). However, since the operation coefficient hx is less than 1 at this time point, the rapid reduction in the light intensity as in a conventional light source device does not subsequently occur, and the light intensity is slowly reduced. However, since the operation coefficient hx continues to gradually increase with progression of deterioration of the light emitting element, the operation coefficient hx eventually reaches 1, and after the time point (tz1), the light intensity is rapidly reduced similarly to the conventional light source device.

Namely, an advantage of the light source device of the present invention in the first way of determining the operation coefficient hx to the deterioration coefficient dx is that, although the initial light intensity target value (Wo) cannot be achieved after the time point (ty1), while the unsatisfied amount is suppressed not to become excessive, a shape of the light intensity maintenance curve (Wf1) can be designed so that the arrival of the time point (tz1) at which a light emitting element becomes unusable due to rapid reduction of the light intensity is delayed. Positions where the time point (ty1) and the time point (tz1) on the light intensity maintenance curve (Wf1) appear can be determined by the shape of the operation coefficient planning function (f1). Namely, control can be performed by setting the value of the operation coefficient hx corresponding to the value of the deterioration coefficient dx corresponding to the initial stage of the life of a light emitting element and how to increase the operation coefficient hx to the increase of the deterioration coefficient dx.

In the second way of determining the operation coefficient hx to the deterioration coefficient dx, the operation coefficient hx is reduced against an increase of the deterioration coefficient dx, and this is like an operation coefficient planning function (f2) illustrated in FIG. 2(a), for example. In a case where the light source device is operated while the substantial upper limit Iu of the output current of each of the drive circuits (P1, P2, . . . ) is set based on the operation coefficient planning function, when a time variation of the total light intensity W obtained by gathering all the radiation luminous fluxes (F, F', F'', . . . ) is represented, the time variation is like a light intensity maintenance curve (Wf2) illustrated in FIG. 2(b), for example.

In the light intensity maintenance curve (Wf2), while the light emitting element (Y1, Y2, . . . ) is new, the initial light intensity target value (Wo) is maintained similarly to the light intensity maintenance curve (Wf0). However, when the value of the operation coefficient hx is a specified value less than 1, for example 0.7, it becomes impossible to achieve the initial light intensity target value (Wo) at a time point (ty2) earlier than the light intensity maintenance curve (Wf0). However, since the operation coefficient hx is less than 1 at this time point, the rapid reduction in the light intensity as in a conventional light source device does not subsequently occur, and the light intensity is slowly reduced. Moreover, since the operation coefficient hx continues to gradually decrease with progression of deterioration of the light emitting element, the operation coefficient hx does not reach 1, and thus, occurrence of a phenomenon in the conventional light source device, in which the light intensity is rapidly reduced can be prevented.

Namely, in the light source device of the present invention in the second way of determining the operation coefficient hx to the deterioration coefficient dx, although the unsatisfied amount from the initial light intensity target value (Wo) quickly increases, this does not depend on progression of deterioration of a light emitting element but is the result that the operation coefficient hx is intentionally lowered, and the advantage is that the life of the light emitting element can be extremely extended until it becomes unusable. A position where the time point (ty2) on the light intensity maintenance curve (Wf2) appears can be determined by the shape of the operation coefficient planning function (f2). Namely, control can be performed by setting the value of the operation coefficient hx corresponding to the value of the deterioration coefficient dx corresponding to the initial stage of the life of a light emitting element and how to decrease the operation coefficient hx to the increase of the deterioration coefficient dx.

In the third way of determining the operation coefficient hx to the deterioration coefficient dx, the value of the operation coefficient hx corresponding to the value of the deterioration coefficient dx corresponding to the initial stage of the life of a light emitting element is a specified value less than 1, for example a value selected from a range of 0.4 to 0.8, and the operation coefficient hx is kept constant against an increase of the deterioration coefficient dx. This is like an operation coefficient planning function (f3) illustrated in FIG. 2(a), for example. In a case where the light source device is operated while the substantial upper limit Iu of the output current of each of the drive circuits (P1, P2, . . . ) is set based on the operation coefficient planning function, when a time variation of the total light intensity W obtained by gathering all the radiation luminous fluxes (F, F', F'', . . . ) is represented, the time variation is like a light intensity maintenance curve (Wf3) illustrated in FIG. 2(b), for example.

In the light source device of the present invention in the third way of determining the operation coefficient hx to the deterioration coefficient dx, the feature is that the unsatisfied amount from the initial light intensity target value (Wo) does not rapidly increase, and the operation coefficient hx does not reach 1; therefore, the rapid reduction in the light intensity as in a conventional light source device can be subsequently prevented. Accordingly, the life of the light emitting element can be extended until it becomes unusable.

Here, a supplementary description of the above description is given. In the above description, as the control method performed by the light emission control circuit (Mp) and the integrating control circuit (Mu), there are used many parameters and variables such as the absolute upper limit Im, the substantial upper limit Iu, the operation coefficient hx, the deterioration coefficient dx, the monochromatic light intensity sum $\sigma$, the expected upper limit of integrating operation total amount $\Sigma f$, the integrating operation total amount $\Sigma$, the expected upper limit of integrating charge amount Qf, the integrating charge amount Q, the expected life time $\tau f$, the integrating operation total time τ, the life span consumption rate α, the light intensity current ratio η, and the standard initial value η0. However, those parameters and variables are concepts of convenience introduced for explaining control operation to be performed with quantitative arrangement for the ease of understanding. Thus, equivalents corresponding to those parameters and variables may not be exactly mounted in a program of a microprocessor constituting the light emission control circuit (Mp) and the integrating control circuit (Mu).

For example, in the above description, the control using two separate variables may be performed using a variable obtained by integrating the two variables, or a portion to be controlled using one variable may be controlled using two variables obtained by dividing the variable to increase flexibility. Such a measure is the matter that can be arbitrarily performed by a program designer in order to achieve the present invention. If the control of the light source device described in this specification is achieved functionally or consequently, the effects can be exercised well as the present invention, regardless of a mounting form on a specific program.

Further, in the present invention, as described above, the deterioration coefficient dx is calculated using, as indicators, the integrating operation total amount Σ or the amounts such as the light intensity value ρ and the output current Ix. However, focusing on other amounts, the amounts are detected or calculated and may be used in the calculation of the deterioration coefficient dx.

For example, a temperature of each of the light emitting elements (Y1, Y2, . . . ) or a temperature of a representative element is detected, and an integrating temperature history amount Θ calculated by time integration of the temperature in energization may be considered. This is because, even if the integrating operation total amount Σ is the same, deterioration of a light emitting element exposed to high temperature for a longer period of time more significantly progresses. In this case, the deterioration controllable monochromatic light source module (Up) may hold an integrating operation total temperature history total amount Ω that is an amount obtained by integrating the integrating operation total amount Σ and the integrating temperature history amount Θ (such as a product of these amounts or a sum of values obtained by multiplying them by a weighting coefficient), and the deterioration coefficient dx may determine the life span consumption rate α by a value of a ratio of the integrating operation total temperature history total amount Ω at the present time to expected upper limit integrating of operation total temperature history total amounts Ωf of the light emitting elements (Y1, Y2, . . . ).

Incidentally, a simple supplementary description of a cooling mechanism for the light emitting element, including the above-described temperature detection means is given. The light emitting element has a structure in which it is thermally in contact with and held by a heat sink including an air cooling type cooling mechanism, a water cooling type cooling mechanism, or electric type cooling mechanism using a Peltier element or the like to release a self-heating amount due to energization. On a surface through which the light emitting element and the heat sink are in contact with each other, a groove is provided in a portion on the light emitting element side or the heat sink side, and it is preferable that a temperature sensor such as a thermocouple is stored in the groove.

In the above case, although the temperature of the light emitting element is exemplified as one of the other amounts to be focused and considered, for example, a temperature of a space in which the light emitting element is installed, a temperature of cooling water, an amount of a ripple component of a current flowing to the light emitting element, a voltage generated in the energization to the light emitting element, and so on may be used.

As described above, in the light source device of the present invention, the life of the light emitting element can be extended while adjusting a balance of a plurality of colors, such as R, G, and B, by feedback control. Therefore, the light source device can be used well as a light source for a projector. Incidentally, even in the same projectors, they are used in various applications for office works, performances, disaster prevention, and so on. Therefore, whether brightness of a projected video or the life of a light emitting element is important cannot be determined beforehand. In the projector of the present invention, the light source device holds a plurality of operation coefficient planning functions φ(dx), and when one of the plurality of the operation coefficient planning functions φ(dx) is selected to be applicable, this problem can be solved. As the plurality of the operation coefficient planning functions φ(dx) held by the light source device, functions in the first, second, or third way of determining the operation coefficient hx to the deterioration coefficient dx or another way may be mixed, and, in addition to this, a plurality of functions used in the first way and having different function forms may be provided.

Figure 3:
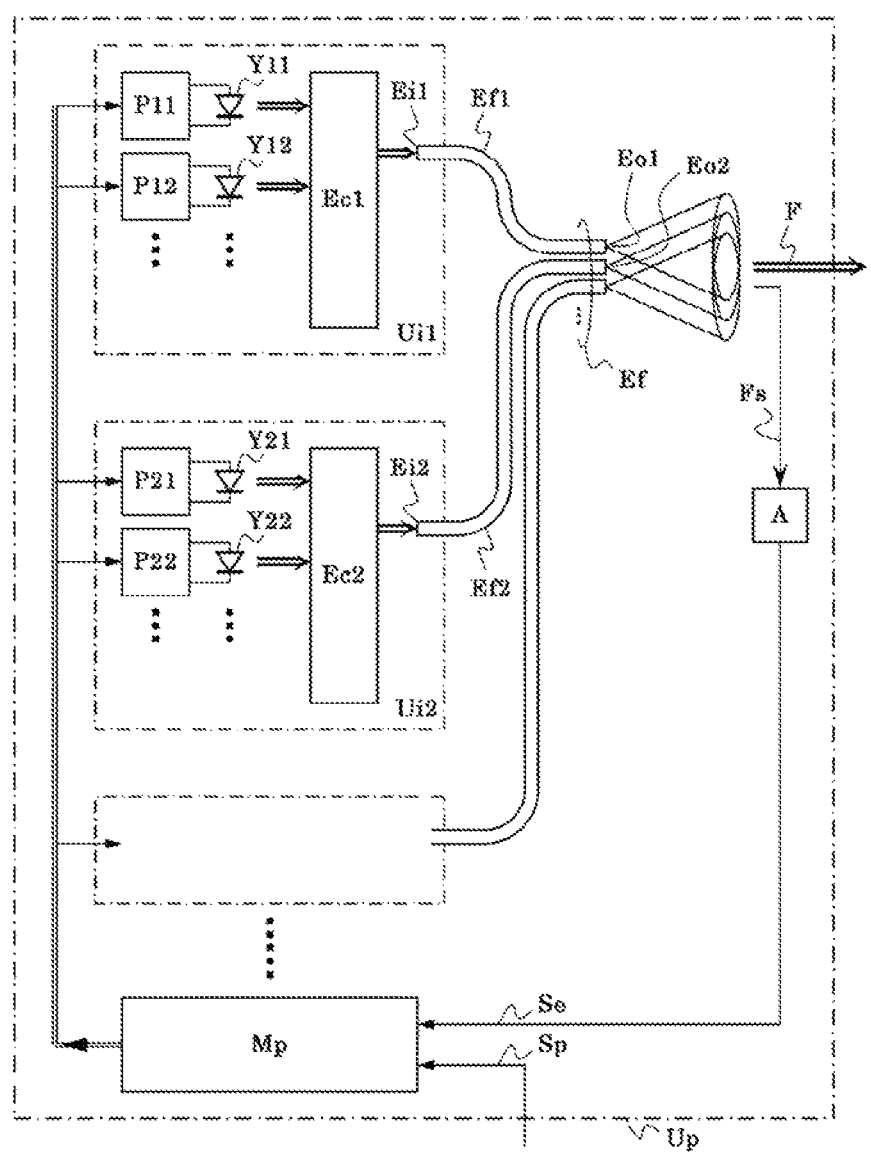
FIG. 3 is a view showing one mode of a portion of an embodiment of the light source device of the invention in a simplified manner.

Next, a configuration of a light source device using an optical fiber will be described using FIG. 3. FIG. 3 is a view showing one mode of a portion of an embodiment of the light source device of the invention in a simplified manner. FIG. 3 shows the deterioration controllable monochromatic light source module (Up) emitting the radiation luminous flux (F) in the R color wavelength band, for example. The light source device can be configured to include another deterioration controllable monochromatic light source module emitting a radiation luminous flux in the same wavelength band or another monochromatic light source module or deterioration controllable monochromatic light source module emitting a radiation luminous flux in a G or B color wavelength band. Light emitted from light emitting elements (Y11, Y12, . . . , Y21, Y22, . . . ) driven by drive circuits (P11, P12, . . . , P21, P22, . . . ) of elemental light sources (Ui1, Ui2, . . . ) are focused at incident ends (Ei1, Ei2, . . . ) of optical fibers (Ef1, Ef2, . . . ) by focusing optical systems (Ec1, Ec2, . . . ) formed of, for example, a lens, and focused light propagates through cores of the optical fibers (Ef1, Ef2, . . . ) and can be emitted from exit ends (Eo1, Eo2, . . . ).

The light emitted from the exit ends (Eo1, Eo2, . . . ) of the optical fibers (Ef1, Ef2, . . . ) of the elemental light sources (Ui1, Ui2, . . . ) are integrated, and the integrated light as a single radiation luminous flux (F) is output from the light source device of the present invention. As the simplest method of integrating light emitted from a plurality of the exit ends (Eo1, Eo2, . . . ), the exit ends (Eo1, Eo2, . . . ) are aligned so as to be positioned on the same plane, and exit end portions of the optical fibers (Ef1, Ef2, . . . ) are bundled to form a fiber bundle (Ef).

Monitor light (Fs) obtained by partially extracting light emitted from the exit ends (Eo1, Eo2, . . . ) and integrating the light is generated so that an amount correlated with the light intensity of the radiation luminous flux (F) guided by each of the optical fibers (Ef1, Ef2, . . . ) can be measured, and the monitor light (Fs) is input to light intensity detection means (A). In this configuration, although the single light intensity detection means (A) is provided to the integrated radiation luminous flux (F) from the elemental light sources (Ui1, Ui2, . . . ), light intensity detection means may be provided for each elemental light source. Specifically, in FIG. 3, the monitor light is branched at a position immediately before or immediately after the focusing optical systems (Ec1, Ec2, . . . ) to enter the light intensity detection means.

The light source device using the optical fiber described herein can be used well as a light source for each projector illustrated in FIGS. 4 and 5 to be described below. In the projectors illustrated in FIGS. 4 and 5, light intensity detection means is provided at a portion subsequent to an exit end of an optical fiber, and the light intensity detection means generates a light intensity detection signal. It should be understood that the light intensity detection means is one which is further embodied as compared with the light intensity detection means (A) illustrated in FIG. 3.

Figure 4:
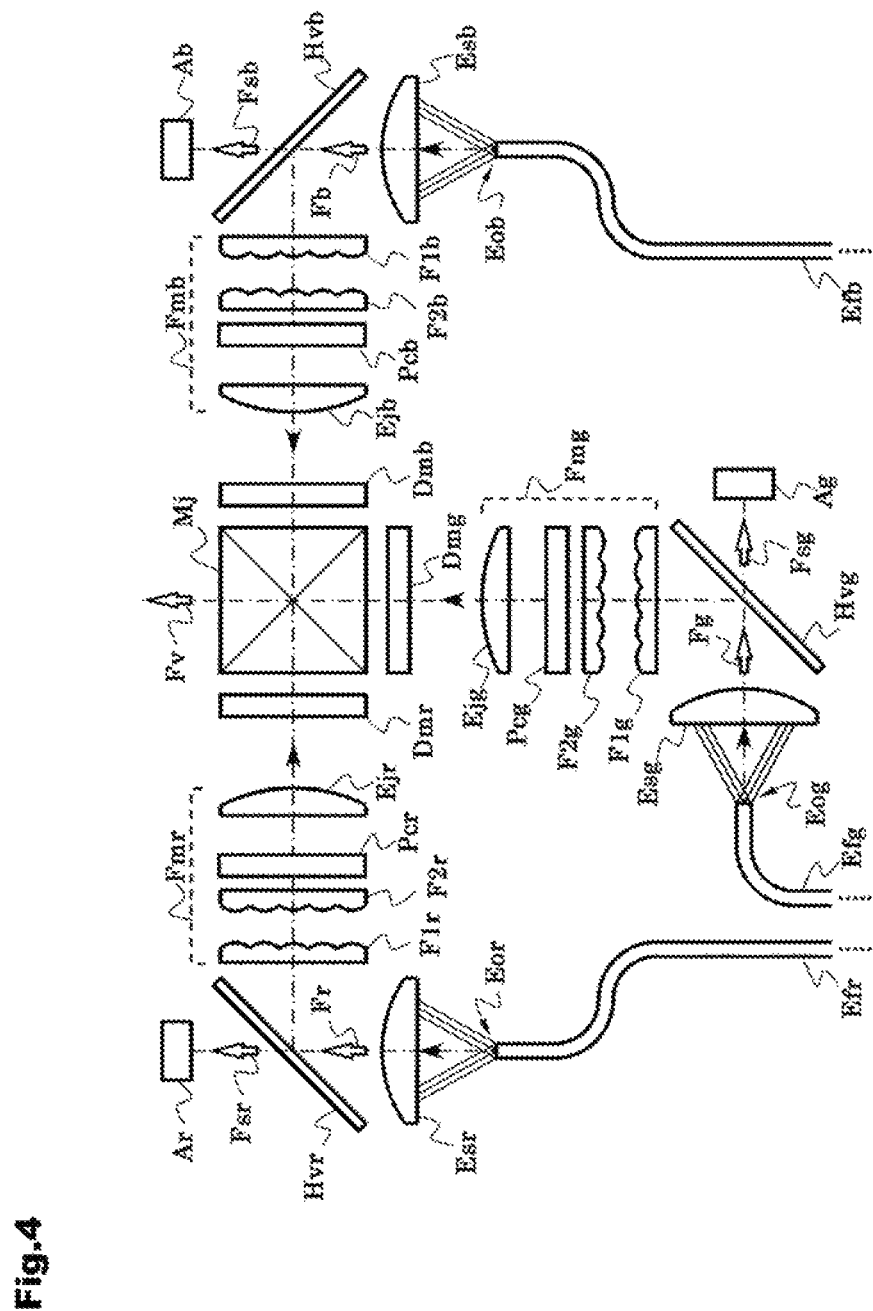
FIG. 4 is a view showing one mode of an embodiment of a projector of the invention in a simplified manner.

Next, as an embodiment for practicing the present invention, configurations of an optical fiber and a portion subsequent to an exit end of the optical fiber in the projector of the present invention using the light source device of this invention will be particularly described using FIG. 4. FIG. 4 is a view showing one mode of an embodiment of the projector of the invention in a simplified manner. In the light source device, fiber bundles corresponding to three primary colors of R, G, and B and formed of a plurality of optical fibers for each color, that is, a fiber bundle (Efr) for an R color light source, a fiber bundle (Efg) for a G color light source, and a fiber bundle (Efb) for a B color light source are configured that exit ends of the optical fibers are aligned and bundled. The forward configuration including each fiber bundle is as illustrated in FIG. 3, for example.

Images at exit ends (Eor, Eog, Eob) of the three fiber bundles are converted into infinite images using collimator lenses (Esr, Esg, Esb) to generate an R color output luminous flux (Fr), a G color output luminous flux (Fg), and a B color output luminous flux (Fb). The luminous fluxes are reflected by mirrors (Hvr, Hvg, Hvb) to enter light uniformizing means (Fmr, Fmg, Fmb) each constituted of a front fly eye lens (F1r, F1g, F1b), a rear fly eye lens (F2r, F2g, F2b), a polarization aligning function element (Pcr, Pcg, Pcb), and an illumination lens (Ejr, Ejg, Ejb) and formed of the above-described fly eye integrator. An LCD for R color image (Dmr), an LCD for G color image (Dmg), and an LCD for B color image (Dmb) which are two-dimensional light amplitude modulation elements by the luminous flux from the light uniformizing means (Fmr, Fmg, Fmb) are illuminated. The transmitted luminous flux is three-color synthesized by a dichroic prism (Mj) to become a luminous flux (Fv) constituting a color image. The luminous flux is projected on a screen by an image projection lens (illustration thereof is omitted.).

The mirrors (Hvr, Hvg, Hvb) are fabricated to efficiently reflect the R color output luminous flux (Fr), the G color output luminous flux (Fg), and the B color output luminous flux (Fb) entering the mirrors. However, unreflected transmitted light exist to no small extent, and normally, such light is discarded as stray light. However, in the light source device of FIG. 4, such light is effectively used to obtain monitor light (Fsr, Fsg, Fsb). The monitor light (Fsr, Fsg, Fsb) enter the R color light intensity detection means (Ar), the G color light intensity detection means (Ag), and the B color light intensity detection means (Ab).

Figure 6:
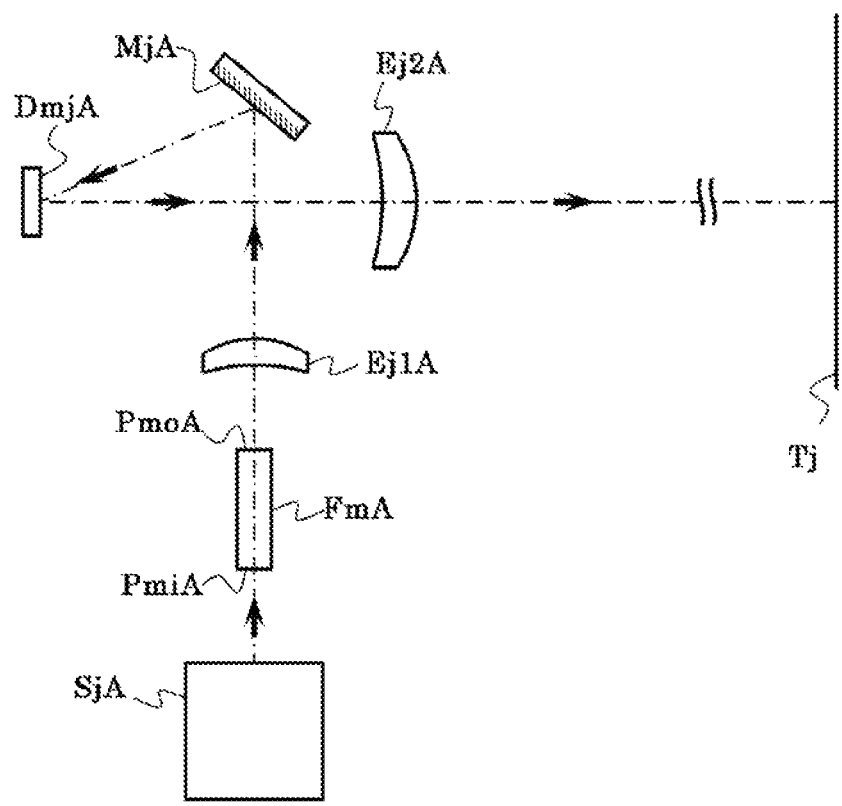
FIG. 6 is a view for explaining one mode of a portion of a kind of conventional projector according to the projector of the invention.

In this embodiment, although the LCD projector using the light uniformizing means formed of a fly eye integrator has been described, the projector of the present invention is naturally applicable to the LCOS™ projector described regarding FIG. 7 and the DMD™ projector described regarding FIG. 6 and using the light uniformizing means formed of an optical guide.

Figure 5:
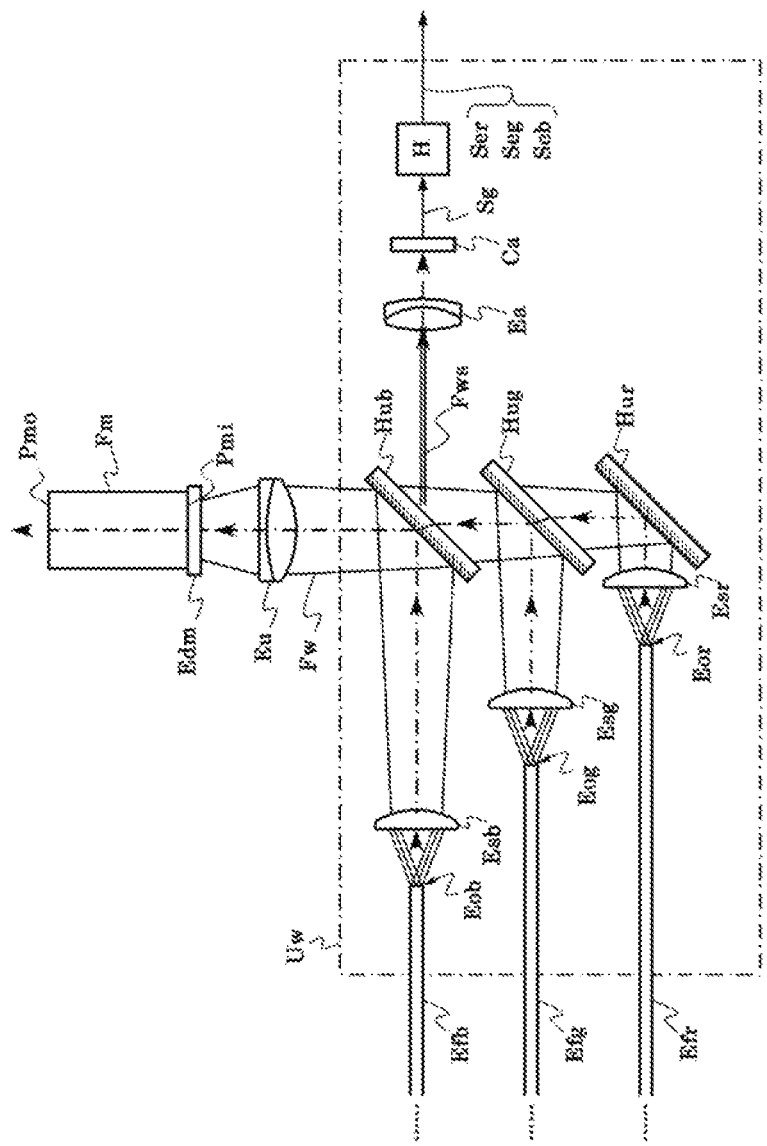
FIG. 5 is a view showing one mode of an embodiment of the projector of the invention in a simplified manner.

Next, as an embodiment for practicing the present invention, configurations of an optical fiber and a portion subsequent to an exit end of the optical fiber in the projector of the present invention using the light source device of this invention will be particularly described using FIG. 5. FIG. 5 is a view showing one mode of an embodiment of the projector of the invention in a simplified manner. In the light source device illustrated in FIG. 5, fiber bundles corresponding to three primary colors of R, G, and B and formed of a plurality of optical fibers for each color, that is, the fiber bundle (Efr) for an R color light source, the fiber bundle (Efg) for a G color light source, and the fiber bundle (Efb) for a B color light source are configured that exit ends of the optical fibers are aligned and bundled. The forward configuration including each fiber bundle is as illustrated in FIG. 3, for example.

Luminous fluxes obtained by converting exit ends of the three fiber bundles into infinite images using the collimator lenses (Esr, Esg, Esb) are color-synthesized using a mirror (Hur) and a dichroic mirror (Hug, Hub) to generate a white color output luminous flux (Fw). Then, the white color output luminous flux (Fw) is input to a condenser lens (Eu) and then enters an incident end (Pmi) of light uniformizing means (Fm) formed of a rod integrator through a diffusion element (Edm) for removing speckle. The optical system subsequent to an emission end (Pmo) of the light uniformizing means (Fm) is similar to that described regarding FIG. 6. The light source device of the present invention can be naturally used in the projector described regarding FIG. 7 and using the light uniformizing means formed of a fly aye integrator. Namely, when the light source (SjA) and the light source (SjB) formed of a conventional high intensity discharge lamp and so on are removed from the projector illustrated in FIG. 6 or 7, a white color light emission optical system (Uw) which outputs the white color output luminous flux (Fw) in FIG. 5 can be used as alternatives.

The dichroic mirror (Hub) is fabricated to allow light of R and G colors to pass therethrough as much as possible and to reflect light of B color as much as possible. However, reflected light of R and G colors and transmitted light of B color exist to no small extent, and normally, such light is discarded as stray light. However, in the light source device in FIG. 5, such light is effectively used to obtain integrated monitor light (Fws). The integrated monitor light (Fws) enters an imaging optical system (Ea) formed of lenses, and a real image conjugate to an exit end (Eor) of R color, an exit end (Eog) of G color, and an exit end (Eob) of B color of the fiber bundle is formed on an imaging surface of a color imaging element (Ca). Video signals (Sg) of those images taken by the color imaging element (Ca) is sent to a light intensity measurement circuit (H).

The light intensity measurement circuit (H) separately measures the light intensity corresponding to one optical fiber at each of the exit end (Eor) of R color, the exit end (Eog) of G color, and the exit end (Eob) of B color based on a video of the color imaging element (Ca). Then, the light intensity measurement circuit (H) monitors whether abnormality of reduction in the light intensity occurs in any of the optical fibers and, at the same time, calculates a sum of the light intensities from the optical fibers transmitting light of the same color to generate an R color light intensity detection signal (Ser), a G color light intensity detection signal (Seg), and a B color light intensity detection signal (Seb).

Namely, in this embodiment, the color imaging element (Ca) functions as the light intensity detection means (A, A', A") for obtaining the light intensity detection signals (Se, Se', Se").

Here, the reason why the abnormality of reduction in the light intensity of each optical fiber is monitored is to detect whether the optical fiber is broken. If an optical fiber transmitting large power is broken, optical power leaks from a broken portion to be absorbed by a covering material provided for mechanically protecting the optical fiber, and thus the covering material may be burned. Therefore, according to the above constitution, if breakage of an optical fiber is detected, safety can be secured by immediate turning off of a light emitting element.

INDUSTRIAL APPLICABILITY

The present invention is applicable in industry of designing or manufacturing a light source device usable in an optical apparatus such as a projector, belonging to a plurality of types of different wavelength bands, and using a light emitting element such as a semiconductor laser.

DESCRIPTION OF REFERENCE SIGNS

A light intensity detection means
A' light intensity detection means
A" light intensity detection means
Ab B color light intensity detection means
Ag G color light intensity detection means
Ar R color light intensity detection means
Ca color imaging element
Dmb LCD for B color image
Dmg LCD for G color image
DmjA two-dimensional light amplitude modulation element
DmjB two-dimensional light amplitude modulation element
Dmr LCD for R color image
Ea imaging optical system
Ec1 focusing optical system
Ec2 focusing optical system
Edm diffusion element
Ef fiber bundle
Ef1 optical fiber
Ef2 optical fiber
Efb fiber bundle
Efg fiber bundle
Efr fiber bundle
Ei1 incident end
Ei2 incident end
Ej1A illumination lens
Ej1B illumination lens
Ej2A image projection lens
Ej2B field lens
Ej3B image projection lens
Ejb illumination lens
Ejg illumination lens
Ejr illumination lens
Eo1 exit end
Eo2 exit end
Eob exit end
Eog exit end
Eor exit end
Esb collimator lens
Esg collimator lens
Esr collimator lens
Eu condenser lens
F radiation luminous flux
F' radiation luminous flux
F" radiation luminous flux
f0 relation line
f1 operation coefficient planning function
F1B front fly eye lens
F1b front fly eye lens
F1g front fly eye lens
F1r front fly eye lens
f2 operation coefficient planning function
F2b rear fly eye lens
F2B rear fly eye lens
F2g rear fly eye lens
F2r rear fly eye lens
F3 operation coefficient planning function
Fb B color output luminous flux
Fg G color output luminous flux
Fm light uniformizing means
FmA light uniformizing means
FmB light uniformizing means
Fmb light uniformizing means
Fmg light uniformizing means
Fmr light uniformizing means
Fr R color output luminous flux
Fs monitor light
Fs' monitor light
Fs" monitor light
Fsb monitor light
Fsg monitor light
Fsr monitor light
Fv luminous flux
Fw white color output luminous flux
Fws integrated monitor light
H light intensity measurement circuit
Hub dichroic mirror
Hug dichroic mirror
Hur mirror
Hvb mirror
Hvg mirror
Hvr mirror
LCD liquid crystal device
Mj dichroic prism
MjA mirror
MjB polarization beam splitter
Mp light emission control circuit
Mu integrating control circuit
P1 drive circuit
P11 drive circuit
P12 drive circuit
P2 drive circuit
P21 drive circuit
P22 drive circuit
Pcb polarization aligning function element
PcB polarization aligning function element
Pcg polarization aligning function element
Pcr polarization aligning function element
Pmi incident end
PmiA incident end
PmiB incident end
Pmo emission end
PmoA emission end
PmoB emission end
Se light intensity detection signal
Se' light intensity detection signal
Se" light intensity detection signal
Seb B color light intensity detection signal Seg G color light intensity detection signal
Ser R color light intensity detection signal
Sg video signal
SjA light source
SjB light source
Sp light intensity target signal
Sp' light intensity target signal
Sp" light intensity target signal
Tj screen
ty1 time point
ty2 time point
tz0 time point
tz1 time point
Ui1 elemental light source
Ui2 elemental light source
Up deterioration controllable monochromatic light source module
Up' monochromatic light source module
Up" monochromatic light source module
Uw white color light emission optical system
Wf0 light intensity maintenance curve
Wf1 light intensity maintenance curve
Wf2 light intensity maintenance curve
Wf3 light intensity maintenance curve
Wo initial light intensity target value
Y1 light emitting element
Y11 light emitting element
Y12 light emitting element
Y2 light emitting element
Y21 light emitting element
Y22 light emitting element
ZiB incident optical axis

The invention claimed is:

1. A light source device emitting radiation luminous fluxes (F, F', F", . . . ) in a plurality of wavelength bands to the outside, and the light source device comprising:
   a deterioration controllable monochromatic light source module (Up), which has:
      light emitting elements (Y1, Y2, . . . ) each emitting light in a specific wavelength band and emits radiation luminous fluxes (F) from the light emitting elements to the outside, further having drive circuits (P1, P2, . . . ) driving the light emitting elements (Y1, Y2, . . . );
      a light emission control circuit (Mp) controlling the drive circuits (P1, P2, . . . ); and
      light intensity detection means (A) detecting a light intensity of the radiation luminous flux (F) to generate a light intensity detection signal (Se) and transmitting the light intensity detection signal (Se) to the light emission control circuit (Mp);
      wherein the light emission control circuit (Mp) being configured to, in order to calculate, with respect to an absolute upper limit Im specified by an output current Ix of each of the drive circuits (P1, P2, . . . ),
         calculate an substantial upper limit Iu, that is a limit value that can be output at that time point, with respect to each of the drive circuits (P1, P2, . . . ),
         determine an operation coefficient hx of each of the drive circuits (P1, P2, . . . ) to be multiplied with the absolute upper limit Im, based on a deterioration coefficient dx representing a degree of deterioration of each of the light emitting elements (Y1, Y2, . . . ) at that time point,
         perform feedback control of the output current Ix of each of the drive circuits (P1, P2, . . . ) in a range where the output current Ix does not exceed the substantial upper limit Iu so that the light intensity detection signal (Se) matches a light intensity target signal (Sp) which is a target value thereof and is input from the outside, and
         output the light intensity detection signal (Se) to the outside;
   one or more monochromatic light source modules (Up', Up", . . . ), which have one or more light emitting elements to emit the radiation luminous fluxes (F, F', F", . . . ) to the outside, output light intensity detection signals (Se', Se", . . . ), generated by detecting the light intensities of the radiation luminous fluxes (F', F", . . . ), to the outside;
      wherein each monochromatic light source module performs feedback control by a light emitting element drive circuit so that the light intensity detection signal (Se', Se", . . . ) matches a light intensity target signals (Sp', Sp", . . . ) which is a target value thereof and
      is input from the outside, and is different from the deterioration controllable monochromatic light source module (Up); and
   an integrating control circuit (Mu) which inputs the light intensity detecting signals (Se, Se', Se", . . . ) and, at the same time, generates the light intensity target signals (Sp, Sp', Sp", . . . ) to output the light intensity target signals (Sp, Sp', Sp", . . . );
   wherein the integrating control circuit (Mu)
      calculates a monochromatic light intensity sum σ by a sum of the light intensity detection signals from the monochromatic light source modules belonging to the same wavelength band, among the light intensity detection signals (Se, Se', Se", . . . ) and
      determines the light intensity target signals (Sp, Sp', Sp", . . . ) so that a ratio of the monochromatic light intensity sum σ to the monochromatic light source modules in different wavelength bands is a predetermined ratio.

2. The light source device according to claim 1, wherein the deterioration controllable monochromatic light source module (Up) holds an integrating operation total amount Σ in each of the light emitting elements (Y1, Y2, . . . ), and the deterioration coefficient dx is determined positively correlated with a life span consumption rate α that is a value of a ratio of the integrating operation total amount Σ at the present time to an expected upper limit of integrating operation total amount Σf of each of the light emitting elements (Y1, Y2, . . . ).

3. The light source device according to claim 1, wherein the deterioration controllable monochromatic light source module (Up) detects a light intensity value ρ of a radiation luminous flux emitted from each of the light emitting elements (Y1, Y2, . . . ), and the deterioration coefficient dx is determined negatively correlated with an efficiency maintenance factor β that is a value of a ratio of a light intensity current ratio η to a standard initial value η0 of the light intensity current ratio η, the light intensity current ratio η being calculated by dividing the light intensity value ρ by the output current Ix of each of the drive circuits (P1, P2, . . . ) that is a value of current flowing to each of the light emitting elements (Y1, Y2, . . . ).

4. The light source device according to claim 1, wherein a value of the operation coefficient hx corresponding to a value of the deterioration coefficient dx corresponding to an initial stage of the life of a light emitting element is a specified value less than 1, and the operation coefficient hx is increased to an increase of the deterioration coefficient dx.

5. The light source device according to claim 1, wherein the operation coefficient hx is decreased to an increase of the deterioration coefficient dx.

6. The light source device according to claim 1, wherein a value of the operation coefficient hx corresponding to a value of the deterioration coefficient dx corresponding to an initial stage of the life of a light emitting element is a specified value less than 1, and the operation coefficient hx is kept constant against an increase of the deterioration coefficient dx.

7. A projector projecting and displaying an image using the light source device according to claim 1.

8. The projector according to claim 7, wherein a value of the operation coefficient hx in the light source device is configured to be capable of being calculated by an operation coefficient planning function φ(dx) that is a function of the deterioration function dx, a plurality of operation coefficient planning functions φ(dx) are held, and one of the plurality of the operation coefficient planning functions φ(dx) is selected to be applicable.

* * * * *